United States Patent
Shastri

(10) Patent No.: US 7,567,094 B2
(45) Date of Patent: Jul. 28, 2009

(54) TRI-STATED DRIVER FOR BANDWIDTH-LIMITED LOAD

(75) Inventor: Kalpendu Shastri, Orefield, PA (US)

(73) Assignee: Lightwire Inc., Allentown, PA (US)

( * ) Notice: Subject to any disclaimer, the term of this patent is extended or adjusted under 35 U.S.C. 154(b) by 0 days.

(21) Appl. No.: 11/807,150

(22) Filed: May 25, 2007

(65) Prior Publication Data

US 2008/0007295 A1   Jan. 10, 2008

Related U.S. Application Data

(60) Provisional application No. 60/813,515, filed on Jun. 14, 2006.

(51) Int. Cl.
*H03K 19/00* (2006.01)
*H03K 19/02* (2006.01)
(52) U.S. Cl. .......................... 326/58; 326/56
(58) Field of Classification Search .................. 326/56, 326/58, 26, 27, 82–86; 375/347, 295, 296
See application file for complete search history.

(56) References Cited

U.S. PATENT DOCUMENTS

| | | | |
|---|---|---|---|
| 4,280,065 A | 7/1981 | Minato et al. | |
| 5,165,046 A | 11/1992 | Hesson | |
| 5,442,307 A | 8/1995 | Shigehara et al. | |
| 5,467,031 A | 11/1995 | Nguyen et al. | |
| 5,493,257 A | 2/1996 | Chadwick | |
| 5,646,550 A * | 7/1997 | Campbell et al. | 326/81 |
| 5,966,026 A * | 10/1999 | Partovi et al. | 326/27 |
| 6,181,166 B1 | 1/2001 | Krishnamurthy et al. | |
| 6,353,343 B1 | 3/2002 | Payne et al. | |
| 6,366,122 B1 | 4/2002 | Krishnamurthy et al. | |
| 6,794,900 B2 | 9/2004 | Tang et al. | |
| 7,065,301 B2 | 6/2006 | Shastri et al. | |
| 7,154,301 B2 | 12/2006 | Levin | |
| 7,177,352 B1 | 2/2007 | Plasterer et al. | |
| 7,276,939 B2 * | 10/2007 | Noto et al. | 326/83 |

* cited by examiner

*Primary Examiner*—James H. Cho
*Assistant Examiner*—Crystal L Hammond
(74) *Attorney, Agent, or Firm*—Wendy W. Koba

(57) ABSTRACT

A CMOS driver circuit is configured to provide a tri-state condition after a predetermined number of like-valued data bits have been transmitted, reducing the presence of intersymbol interference (ISI) along a transmission channel. In situations where the transmission channel is bandwidth-limited, the use of the tri-stating technique allows for the complete transition to the supply rails during the given bit period.

12 Claims, 4 Drawing Sheets

(N=2)

TRI-STATED DRIVER FOR BANDWIDTH-LIMITED LOAD

CROSS-REFERENCE TO RELATED APPLICATION

This application claims the benefit of Provisional Application No. 60/813,515, filed Jun. 14, 2006.

TECHNICAL FIELD

The present invention relates to a driver circuit for bandwidth-limited loads and, more particularly, to the use of a tri-stated driving device to reduce the potential for intersymbol interference (ISI) in bandwidth-limited loads.

BACKGROUND OF THE INVENTION

When digital data signals that contain long runs of either ones or zeroes are sent over a long transmission line, the edges that correspond to the data transitions (either 0→1 or 1→0) become severely distorted by the bandwidth limitation and the frequency dispersion of the transmission line. This phenomenon, known as inter-symbol interference (ISI), moves the transition edges associated with these long runs from their ideal clock positions, thus interfering with the correct recovery of data by the receiver.

Data transmission system designers have taken a system approach to mitigate the problem of ISI by utilizing a technique referred to as "pre-emphasis" in the driver circuit. For example, the transmission line driver asserts a lower voltage level "1" that is less strong than a nominal "1" voltage level prior to transitioning to the "0" voltage level. In a similar manner, the transmission line driver asserts a higher voltage level "0" (compared to the nominal value) prior to transitioning to the "1" voltage level. These emphasized transitions tend to compensate for the anticipated distortion of the pulses that follow long high or long low bit sequences. In typical prior art arrangements, the emphasis is provided by sourcing current through a resistor to generate the drive voltage. As a result, a reduced current is driven for the 1→1 or 0→0 bit transitions, as compared to the level-shifting 1→0 or 0→1 bit transitions. While useful, this approach requires a relatively high power and is not suitable for low power applications, such as CMOS drivers.

Thus, a need remains in the art for an arrangement that addresses the ISI concerns of high speed CMOS transmission systems where pre-emphasis arrangements require too much power to be effective.

SUMMARY OF THE INVENTION

The needs remaining in the prior art are addressed by the present invention, which provides a lower power alternative approach to reducing ISI in bandwidth-limited loads by using a tri-state driver that transitions to a high impedance state during long runs of like-valued bits ("long runs" being determined by the system designer and may, in fact, be as short as a "run" of two like-valued bits).

In accordance with the present invention, a tri-stated drive signal is utilized to drive a bandwidth-limited load (or channel). In one embodiment, the tri-stated device drives the load for only the first bit during transitions in the data stream (i.e., a "one-shot" driver). Once the tri-stated device drives the load/channel, the driver remains in the tri-state mode until the next transition in logic level appears along the bit stream. This mode is achieved by having the tri-state device turn OFF both MOS devices used to generate the drive signal, thus transitioning to a high impedance state at this node. As a result, the output drive signal will reach the same potential for each following data bit transition, regardless of the length of a preceding string of 0's or 1's. The use of the tri-state output drive signal thus results in essentially eliminating the possibility of intersymbol interference.

It is an advantage of the present invention that the tri-stated driver may be used as the driver for a modulator, such as a Mach-Zehnder modulator (for example, an electro-optic modulator) operating at speeds in excess of 10 Gb/s.

In another embodiment of the present invention, the tri-state driver may be configured to utilize a plurality of N bits to drive the channel, and then remain at the tri-state signal level subsequent to the transmission of a string of N like-valued bits.

The load may comprise MOS devices as a single pair of MOS transistors (one n-channel and one p-channel) or, alternatively the MOS devices comprise a plurality of n-channel transistors in a parallel arrangement and/or a separate plurality of p-channel transistors disposed in a parallel arrangement. The tri-state driver itself may comprise MOS devices, or devices of any other suitable technology, such as bipolar technology, as desired.

Various and other advantages and embodiments of the present invention may become apparent during the course of the following discussion and by reference to the accompanying drawings.

BRIEF DESCRIPTION OF THE DRAWINGS

Referring now to the drawings.

DETAILED DESCRIPTION

Figure 1:
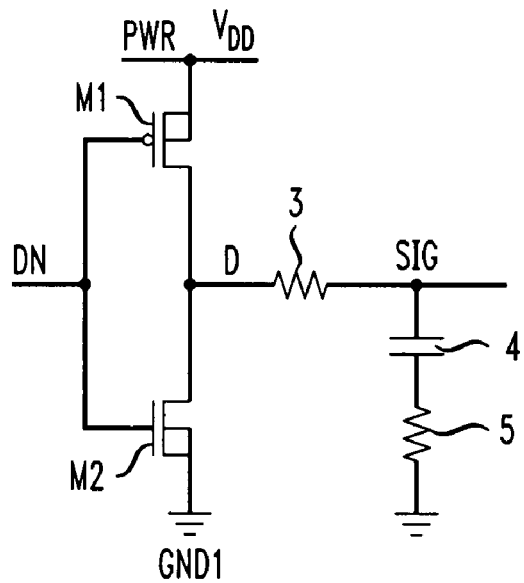
FIG. 1 contains a schematic of a prior art CMOS driver circuit.

FIG. 1 illustrates an exemplary prior art CMOS driver circuit comprising a p-type MOS transistor M1 and an n-type MOS transistor M2, where the gates of MOS transistors M1 and M2 are coupled together and receive the incoming data signal DN. Depending on whether the current data bit is a "0" or "1", either M1 or M2 will be turned ON, providing an input driving signal D at the junction where the source of M1 is coupled to the drain of M2. Inasmuch as the gates of transistors M1 and M2 are coupled together and respond to the same input signal, the outputs will necessarily be of complementary value. As shown, the drain of M1 is coupled to voltage source $V_{DD}$ and the source of M2 is coupled to ground, defining the provided voltage swing (rail-to-rail) for the data signal. It is to be understood that in general the driver circuit may comprise MOS devices in the form of a plurality of n-channel transistors (such as M1) connected together in parallel and/or a plurality of p-channel transistors (such as M2) connected together in parallel.

For the purposes of discussion, the RC load driven by input driving signal D is shown as comprising a first resistor 3, a capacitor 4 and a second resistor 5, configured in the manner shown in FIG. 1. In this case, the output drive signal is denoted as SIG, at the junction between first resistor 3 and capacitor 4. The time constant of this RC network determines the bandwidth of the channel in a conventional manner. If the switching speed of input driving signal D is not limited by this RC time constant, the bit values of "1" and "0" will have sufficient time to reach the voltage supply values for output drive signal SIG (i.e., VDD, GND) during the bit period.

However, if the switching speed (i.e., data rate) of the incoming signal DN is greater than the bandwidth of the RC load/channel, output drive signal SIG will require more than a single bit period to reach its full voltage supply value. Thus, the value of one bit will "spill over" into the adjacent bit period, leading to a smearing of the values of the output data train and is oftentimes referred to in the art as "intersymbol interference", or ISI. When ISI is present, amplitude and phase jitter is present and results in transmission errors along the signal path.

Figure 2:
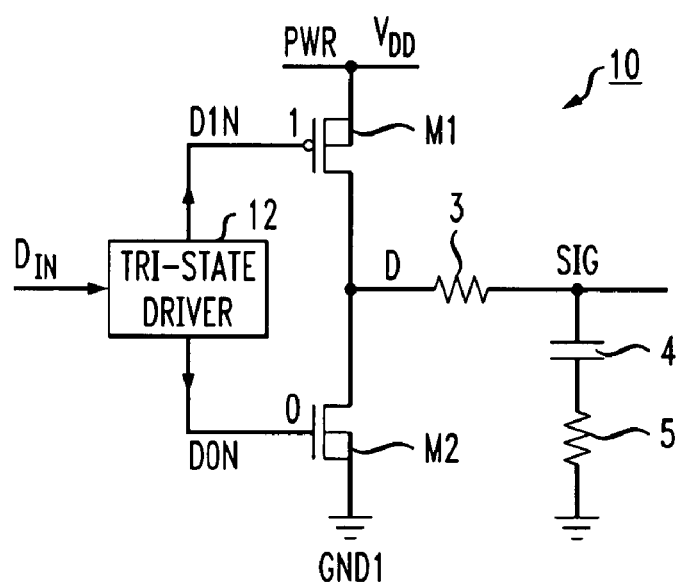
FIG. 2 contains a schematic of a tri-stated drive circuit of the present invention.

FIG. 2 illustrates an exemplary tri-state CMOS driver circuit 10 formed in accordance with the present invention that addresses the problems associated with ISI in the prior art circuits (where like elements have the same reference numerals as those elements in FIG. 1). A tri-state driver 12, responsive to input data signal $D_{IN}$, is utilized to provide separate gating inputs to MOS transistors M1 and M2. Thus, unlike the prior art arrangement, the operation of transistors M1 and M2 is separately controlled in the arrangement of the present invention. In particular, a first signal D1N from tri-state driver 12 is applied as the gate input to control p-channel device M1, and a separate, second signal D0N from tri-state driver 12 is applied as the gate input to control n-channel device M2. In its implementation, tri-state driver 12 may comprise MOS components, or may be formed of devices associated with another technology, such as bipolar devices.

In one embodiment of the present invention, tri-state driver 12 will drive the load for only one bit (the first bit) during the transition from either a logic "1" or logic "0", or from a logic "0" to a logic "1". For example, if the first bit is a logic "1", tri-state driver 12 will turn ON transistor M1, bringing the voltage at node D up to the VDD level (i.e., "high"). Alternatively, if the first bit is a logic "0", tri-state driver 12 will turn ON transistor M2, bringing the voltage at node D down to the GND level (i.e., "low"). After the first transition, if the following bit at $D_{IN}$ is of the same value, tri-state driver 12 will turn OFF both M1 and M2, resulting in a high impedance state at node D. The potential associated with output driver signal SIG will remain at the voltage level achieved during the transition when one of either transistor M1 or M2 was ON, pulling node D to either the logic "1" or logic "0" level. As a result, the signal SIG remains/holds at the same value, denoted as Z in FIG. 3. The following truth table illustrates the possible values associated with the various elements in the arrangement of FIG. 2:

| data in ($D_{IN}$) | D1N | D0N | M1 | M2 | D | SIG |
|---|---|---|---|---|---|---|
| same logic value as previous bit | "1" | "0" | OFF | OFF | high impedance | Z |
| opposite logic value as previous bit, now logic "1" | "1" | "0" | ON | OFF | low impedance | ⇑ VDD |
| opposite logic value as previous bit, now logic "0" | "0" | "1" | OFF | ON | low impedance | ⇓ GND |

Figure 3:
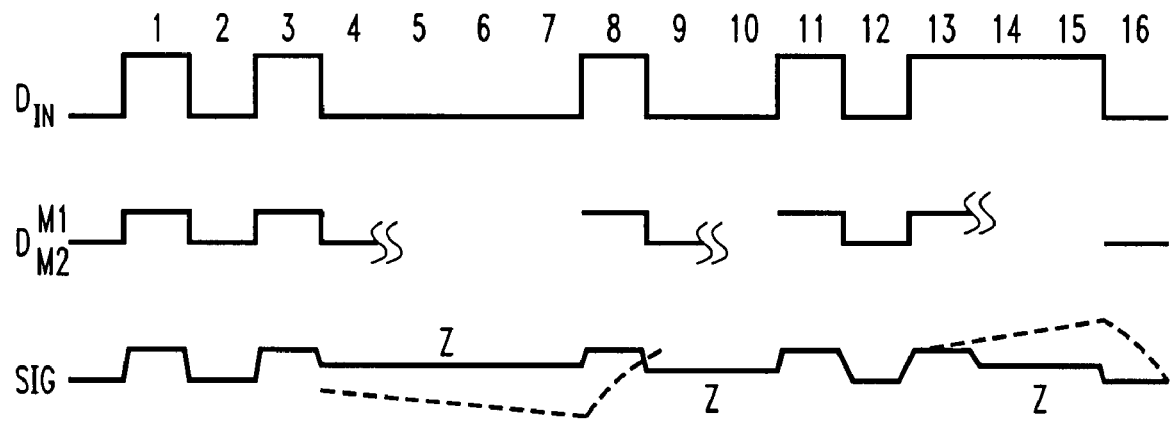
FIG. 3 is a timing diagram of an exemplary binary data signal and an associated tri-state signal utilized as the drive signal in accordance with the present invention.

FIG. 3 is a timing diagram showing the bit pattern of the input data bits, the tri-stated driver signal appearing at node D, and output drive signal SIG. In this exemplary data bit pattern, a logic "0" is presented for a sequence of four data bits (time slots 4, 5, 6 and 7). For the first bit in the pattern, tri-state driver 12 will turn ON transistor M2, and turn OFF transistor M1. In accordance with the present invention, when the second data bit of value "0" is desired to be transmitted (time slot 5 in FIG. 3), tri-stated driver 12 will turn OFF transistor M2, maintain transistor M1 in its OFF state, and thus present a high impedance state at node D. This action effectively disconnects node D from the remainder of the circuit (designated by the "//" symbol in the timing diagram) such that input driving signal D remains "tri-stated" until the next transition to the logic "1" value, in this example at time slot 8.

In conventional prior art arrangements, the presence of a long string of like-valued bits creates the situation where the associated input transistor (in this case, transistor M2) remains ON, allowing for more and more current to be sourced by the load so as create an undershoot situation (shown in the dotted line portion of D in the timing diagram of FIG. 3), in this case of a string of "0"s, driving low beyond the negative supply rail. Thus, at time slot 8 (when the driver needs to move to VDD), the output drive signal SIG needs to travel a larger distance to reach its full VDD potential. As shown in the dotted line portion along FIG. 3, since output drive signal SIG starts its movement from a value well below GND, it will take more than one bit period to reach the desired VDD value, resulting in the creation of ISI. Obviously, the longer the string of like-valued bits, the greater the degree of resulting ISI.

Thus, by using tri-state driver 12 in accordance with the present invention, the overshoot problem is substantially reduced by "tri-stating" the driving transistors until the next transition in data bit value. Referring to FIG. 3, tri-state driver 12 functions to turn OFF both transistors M1 and M2 during time slots 5, 6 and 7 and therefore does not source any additional current from the load. The value at SIG will then naturally decay to a value associated with the RC load (shown as Z in FIG. 3) and remain at this value until the next logic value transition. This tri-state operation prevents the load signal from undershooting and allows for the complete movement to VDD during the transition at time slot 8.

Figure 4:
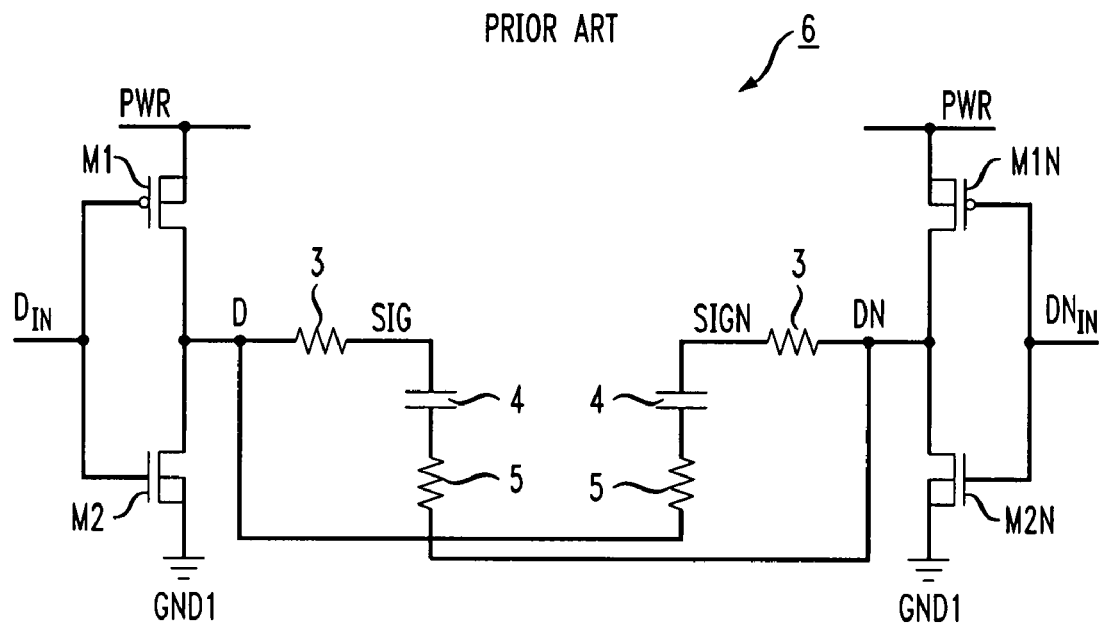
FIG. 4 contains a schematic of a prior art CMOS drive circuit for a modulator arrangement, supplying complementary input signals thereto.
Figure 5:
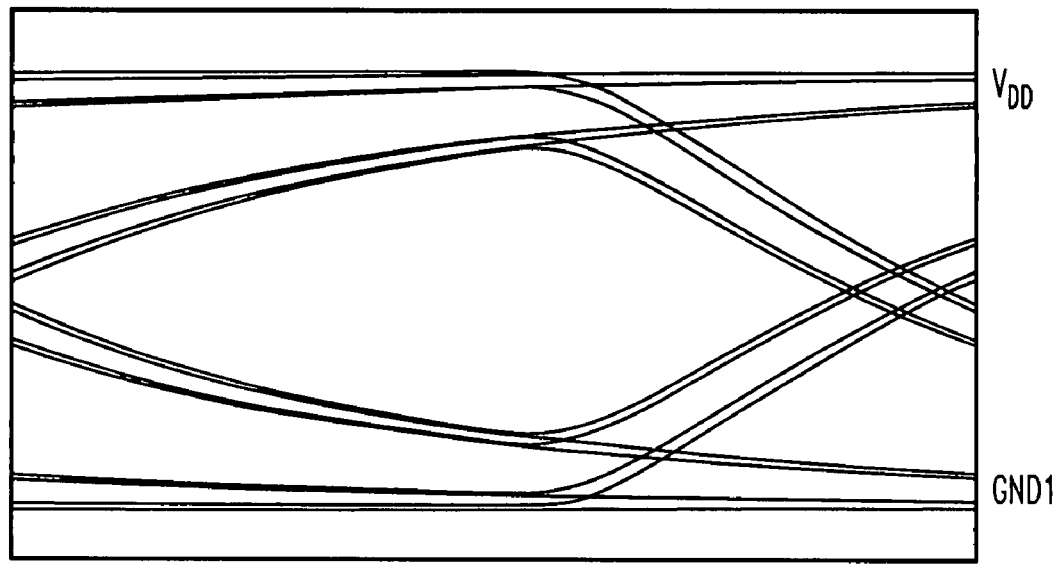
FIG. 5 is an 'eye diagram' illustrating the deleterious effects of intersymbol interference (ISI) resulting from the use of the prior art drive circuit of FIG. 4.

As mentioned above, the tri-stated driver arrangement of the present invention may be used with the inputs applied to the arms of a modulator, such as a high speed Mach-Zehnder modulator. FIG. 4 is a schematic of a conventional prior art CMOS modulator driver 6, with driving signals $D_{IN}$ and $DN_{IN}$ used to drive the separate arms of the associated modulator (where DN denotes the inverse/complement of D). The input data signal to driver 6 is shown as D and DN. The pair of output signals SIG and SIGN are taken at the junction between resistor 3 and capacitor 4, as discussed above. FIG. 5 contains an eye diagram illustrating the transition between logic "1" and logic "0" levels for driver 6, when driving a pseudo-random bit sequence. It is clear that ISI is present in this diagram, with amplitude and phase jitter resulting in an unacceptable bit error rate value.

Figure 6:
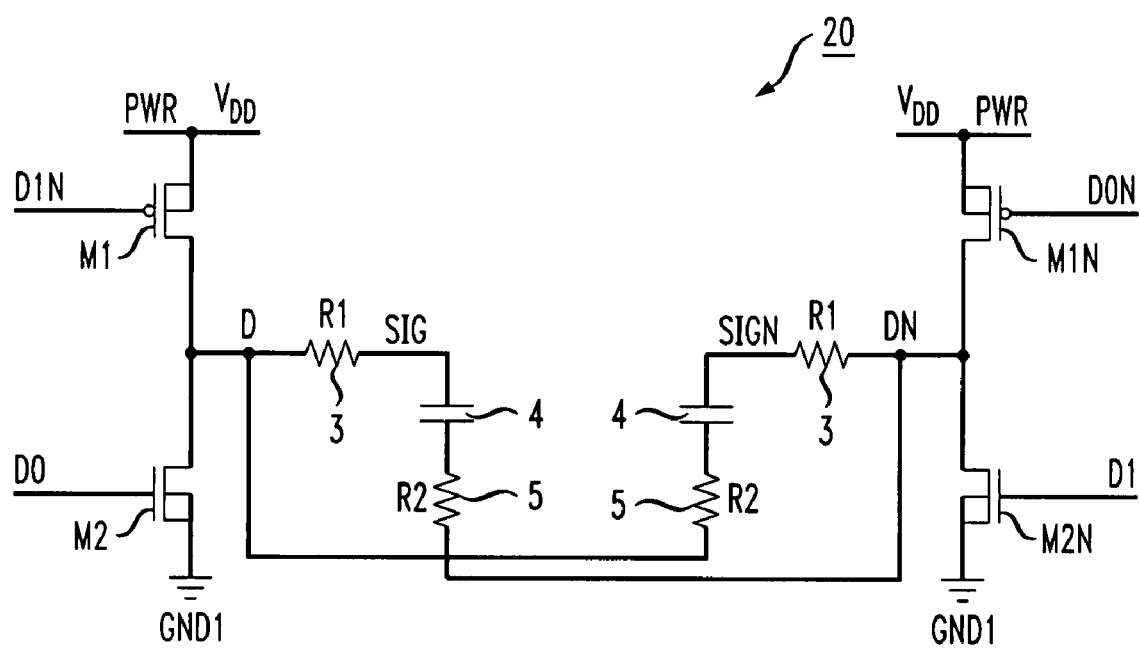
FIG. 6 contains a schematic of an exemplary tri-stated driver circuit formed in accordance with the present invention for use with a modulator arrangement.
Figure 7:
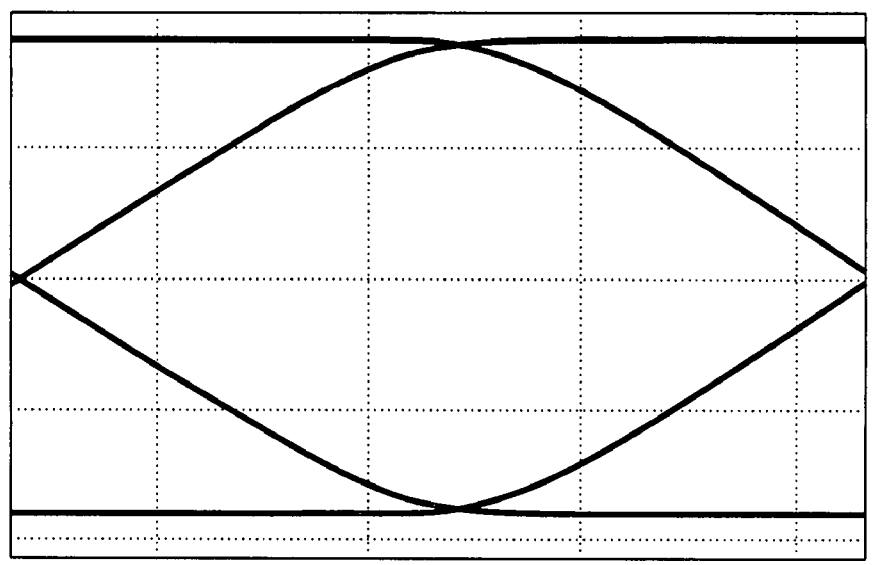
FIG. 7 is an 'eye diagram' associated with the driver circuit of FIG. 6, illustrating the reduction of ISI associated with the use of a tri-stated drive signal.

FIG. 6 illustrates an exemplary tri-stated CMOS driver circuit 20 formed in accordance with the present invention to provide complementary input signals to a modulator, as an improvement to the arrangement of FIG. 4. Similar to the arrangement of the present invention discussed above in association with FIG. 2, separate pairs of input signals are utilized to drive each MOS transistor in the pair, such that a train of like-valued bits will result in tri-stated driver circuit 20 turning OFF all transistors M1, M1N, M2 and M2N so as to create a high impedance state at nodes D and DN until the next data bit value transition. As with the arrangement described above, the presence of the high impedance at nodes D and DN prevents a long sequence of like-valued bits from continuing to draw current and creating both an undershoot (at GND) and overshoot (at VDD) condition. FIG. 7 is an eye diagram associated with this arrangement, representing differential output driving signals SIG and SIGN. The improvement in terms of ISI and amplitude/phase jitter when compared to the eye diagram of FIG. 5 is significant. Indeed, the amplitude and phase jitter is essentially eliminated by virtue of using the tri-stated output driver in accordance with the present invention.

Figure 8:
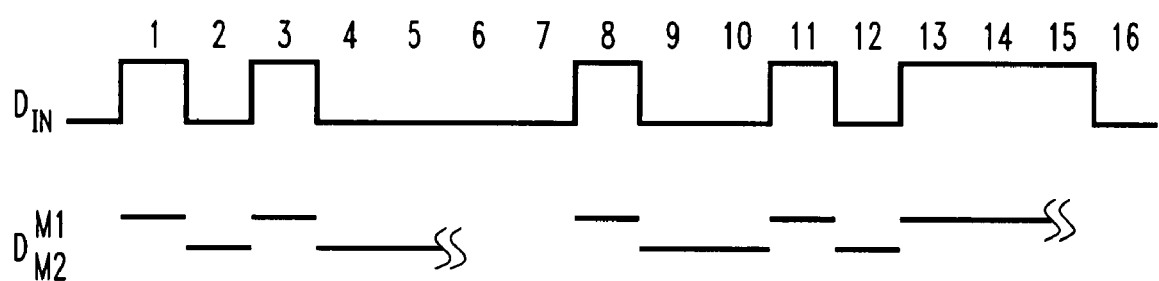
FIG. 8 is a timing diagram associated with an alternative embodiment of the present invention, where two sequential data bits of the same logic value are permitted prior to transitioning the driver to the tri-state value.

In an alternative embodiment of the present invention, as mentioned above, the driving signal D may be permitted to transmit a longer string of like-valued bits prior to moving to the intermediate tri-state value. Presuming that two like-valued bits are permitted to be transmitted prior to tri-stating, the timing diagram of FIG. 8 illustrates the value of the associated driving signal D. For different types of circuits, the use of the N=2 as the tri-state threshold may be preferred, where in general any suitable value of N may be used.

Indeed, although specific embodiments have been illustrated and described herein, it will be appreciated by those of ordinary skill in the art that any arrangement which achieves the same tri-stated operational mode may be substituted for the specific embodiments shown. This application is intended to cover any adaptations or variations of the present invention. Therefore, it is intended that this invention be limited only by the claims appended hereto and the equivalents thereof.

What is claimed is:

1. A driver circuit for generating an output drive signal (SIG) associated with a bandwidth-limited load, where the driver circuit is configured to reduce the presence of intersymbol interference and comprises:
   a first MOS device, responsive to a first control signal, for providing a drive input signal (D) at a first logic level to the bandwidth-limited load during a transition from a first data value to a second data value;
   a second MOS device, of opposite conductivity type and responsive to a second control signal, for providing a drive input signal (D) at a second, opposite logic level to the bandwidth-limited load during a transition from the second data value to the first data value, the first and second MOS devices coupled together to provide the drive input signal to the bandwidth-limited load to generate the output drive signal (SIG); and
   a tri-state device, responsive to an input data signal and providing the first and second control signals to the first and second MOS devices, respectively, and configured to turn OFF the first and second MOS devices after the transmission of a pair of like-valued data bits, allowing the output drive signal (SIG) to thereafter transition to one of the first and second logic levels and reduce intersymbol interference during the transition.

2. A driver circuit as defined in claim 1 wherein the first MOS device is a p-channel device and the second MOS device is an n-channel device.

3. A driver circuit as defined in claim 1 wherein the first MOS device is an n-channel device and the second MOS device is a p-channel device.

4. A driver circuit as defined in claim 1 wherein the tri-state device is configured such that at most only the first MOS device or the second MOS device is ON at one time.

5. A driver circuit as defined in claim 1 wherein the tri-state device is an MOS technology device.

6. A driver circuit as defined in claim 1 wherein the tri-state device is of a technology other than MOS.

7. A driver circuit as defined in claim 6 wherein the tri-state device is a bipolar technology device.

8. A driver circuit as defined in claim 1 wherein the first MOS device comprises a plurality of parallel-connected MOS transistors.

9. A driver circuit as defined in claim 1 wherein the second MOS device comprises a plurality of parallel-connected MOS transistors.

10. A driver circuit as defined in claim 1 wherein the first MOS device comprises a plurality of parallel-connected MOS transistors and the second MOS device comprises a plurality of parallel-connected MOS transistors.

11. A driver circuit as defined in claim 1 wherein the first MOS device comprises a single MOS transistor and the second MOS device comprises a single MOS transistor.

12. A driver circuit as defined in claim 1 wherein the bandwidth-limited load comprises a high speed Mach-Zehnder modulator.

* * * * *